United States Patent [19]

Shibata

[11] Patent Number: 5,521,430
[45] Date of Patent: May 28, 1996

[54] SEMICONDUCTOR APPARATUS AND ITS MANUFACTURING METHOD

[75] Inventor: Kazutaka Shibata, Kyoto, Japan

[73] Assignee: Rohm Co., Ltd., Kyoto, Japan

[21] Appl. No.: 290,521

[22] Filed: Aug. 15, 1994

Related U.S. Application Data

[62] Division of Ser. No. 968,121, Oct. 29, 1992.

[30] Foreign Application Priority Data

Oct. 29, 1991 [JP] Japan ..................... 3-311823

[51] Int. Cl.⁶ .................................. H01L 23/495
[52] U.S. Cl. .......................... 257/676; 257/666
[58] Field of Search .................. 257/666, 676, 257/735

[56] References Cited

U.S. PATENT DOCUMENTS

| | | |
|---|---|---|
| 3,436,810 | 4/1969 | Kauffman . |
| 3,559,285 | 2/1971 | Kauffman . |
| 3,574,815 | 4/1971 | Segerson . |
| 4,099,200 | 7/1978 | Koutalides ............... 257/735 |
| 4,942,452 | 7/1990 | Kitano et al. ............ 257/676 |
| 4,942,454 | 7/1990 | Mori et al. ............... 257/676 |
| 5,221,859 | 6/1993 | Kobayashi et al. ...... 257/676 |
| 5,223,240 | 6/1993 | Ishikawa et al. ........ 257/676 |
| 5,233,222 | 8/1993 | Diennas et al. ......... 257/676 |
| 5,329,158 | 7/1994 | Lin .......................... 257/666 |

FOREIGN PATENT DOCUMENTS

| | | |
|---|---|---|
| 62-15845 | 1/1987 | Japan . |
| 62-193162 | 8/1987 | Japan . |

*Primary Examiner*—Sara W. Crane
*Assistant Examiner*—S. V. Clark
*Attorney, Agent, or Firm*—Nikaido, Marmelstein, Murray & Oram

[57] ABSTRACT

A hole is formed in a metal plate, and after a concave portion is formed by pressurizing a predetermined area on the metal plate including the hole to cause plastic deformation, an island of a lead frame is formed in the concave portion. By forming the concave portion, the island and the inner lead are thinner than the outer lead, and the hole which has become smaller remains in the island.

2 Claims, 11 Drawing Sheets

SEMICONDUCTOR APPARATUS AND ITS MANUFACTURING METHOD

This is a division, of application Ser. No. 07/968,121 filed Oct. 29, 1992.

BACKGROUND OF THE INVENTION

1. Field of the Invention

The present invention relates to a semiconductor apparatus such as an IC (integrated circuit) package and its manufacturing method.

2. Description of the Prior Art

Generally, semiconductor apparatuses such as IC packages are manufactured through processes such as a die bonding process (chip bonding process), a wire bonding process and a resin molding process. These processes are executed with respect to lead frames.

FIG. 1 is a plan view showing a principal portion of an example of a lead frame for use in a conventional QFP (quad flat package). P shows an area corresponding to one package. A lead frame 21 includes an island 22 on which a semiconductor chip is to be provided, a plurality of inner leads 24 connected to electrodes of the semiconductor chip provided on the island 22, outer leads 25 formed continuously from the inner leads 24 and used for connection to a substrate, and a guide rail 26 provided with a guide hole 26a for positioning.

Moreover, the lead frame 21, which is manufactured for every semiconductor device according to specifications such as a configuration and the number of terminals of a semiconductor chip bonded onto the island 22, is generally formed by punching a thin conductive metal plate by use of a punching metal mold or by using an etching method in which the thin conductive metal plate is brought into contact with etchant through a mask having a predetermined opening pattern.

To manufacture a semiconductor apparatus by use of the lead frame 21, first, a semiconductor chip is bonded onto the island 22 of the lead frame 21 in the chip bonding process. Then, the tips of the inner leads 24 extending toward the island 22 and electrodes of the semiconductor chip are connected with gold wire in the wire bonding process. Thereafter, the island 22 and the inner leads 24 are molded by being encapsulated in resin in the resin molding process, and the molded portion is cut off from the lead frame 21 in a lead cutting process. The molded portion which is cut off is a completed semiconductor apparatus.

The thickness of a semiconductor apparatus such as an IC package depends on the sum of the thickness of the lead frame 21, a semiconductor chip provided on the island 22 and wire for bonding.

Since the lead frame 21 is manufactured by punching a flat metal plate of uniform thickness or by etching as described above, the island 22, the inner lead 24 and the outer lead 25 are formed to be of the same thickness. Generally, the thickness is 0.25 mm in DIPs (dual in-line packages), and 0.15 mm in SOPs (small outline packages) and QFPs.

Therefore, in order to realize a thinner semiconductor apparatus, the lead frame 21 must be thinner. If the entire lead frame 21 is thinner, however, the outer lead 25 required to have mechanical strength may not sufficiently be strong, or the heat conduction capacity thereof may decrease.

In order to solve such a problem, it is considered to increase the thickness of the lead frame 21 until the outer lead 25 is sufficiently strong. In this case, however, manufacturing of semiconductor apparatuses having a large number of terminals which manufacturing requires fine processing is impossible. That is, in order to increase the number of terminals of a semiconductor apparatus without changing its dimensions, pitch fining of the inner lead 24 must be realized. Since whether the pitch fining is possible or not depends on the thickness of a metal plate of which the lead frame 21 is made, the pitch fining of the inner lead 24 is limited if the lead frame 21 is thick. As a result, it is impossible to realize a thinner semiconductor apparatus which requires to have a finer pattern.

To solve these problems, it is considered to form a lead frame 21 where the island 22 and the inner lead 24 are formed to be thinner than the outer lead 25. However, merely thinning the island 22 introduces another problem that the island 22 is distorted in providing a semiconductor chip onto the island 22 in the die bonding process. Moreover, if a portion where the island 22 and the inner lead 24 are formed is made thinner than the outer lead 25 by pressurizing it through rolling or stamping, since the portion to be formed thin is surrounded by a nonprocessed portion such as the outer lead 25 as shown in FIG. 1, the entire lead frame 21 is distorted.

SUMMARY OF THE INVENTION

An object of the present invention is to provide a semiconductor apparatus manufacturing method by which a portion including an island is formed to be thinner than an outer lead without a lead frame of the semiconductor apparatus being distorted.

To achieve the above-mentioned object, a semiconductor apparatus manufacturing method of the present invention includes the following processes: a hole forming process of forming a hole along a thickness of a lead frame member; a concave portion forming process of forming a concave portion in a predetermined area including the hole in the lead frame member by pressurizing the predetermined area to cause plastic deformation so that the lead frame member is thin; and an island forming process of forming in the predetermined area an island on which a semiconductor chip is to be provided.

According to such a method, since a material for the lead frame member in the predetermined area is extended in a direction in which the size of the hole is decreased due to the plastic deformation through the pressurizing processing, no distortion is generated in the lead frame obtained by the method.

Moreover, in a semiconductor apparatus obtained by the above-described manufacturing method, generation of distortion due to die bonding can be prevented in spite that a portion including the island is formed to be thinner than the outer lead.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
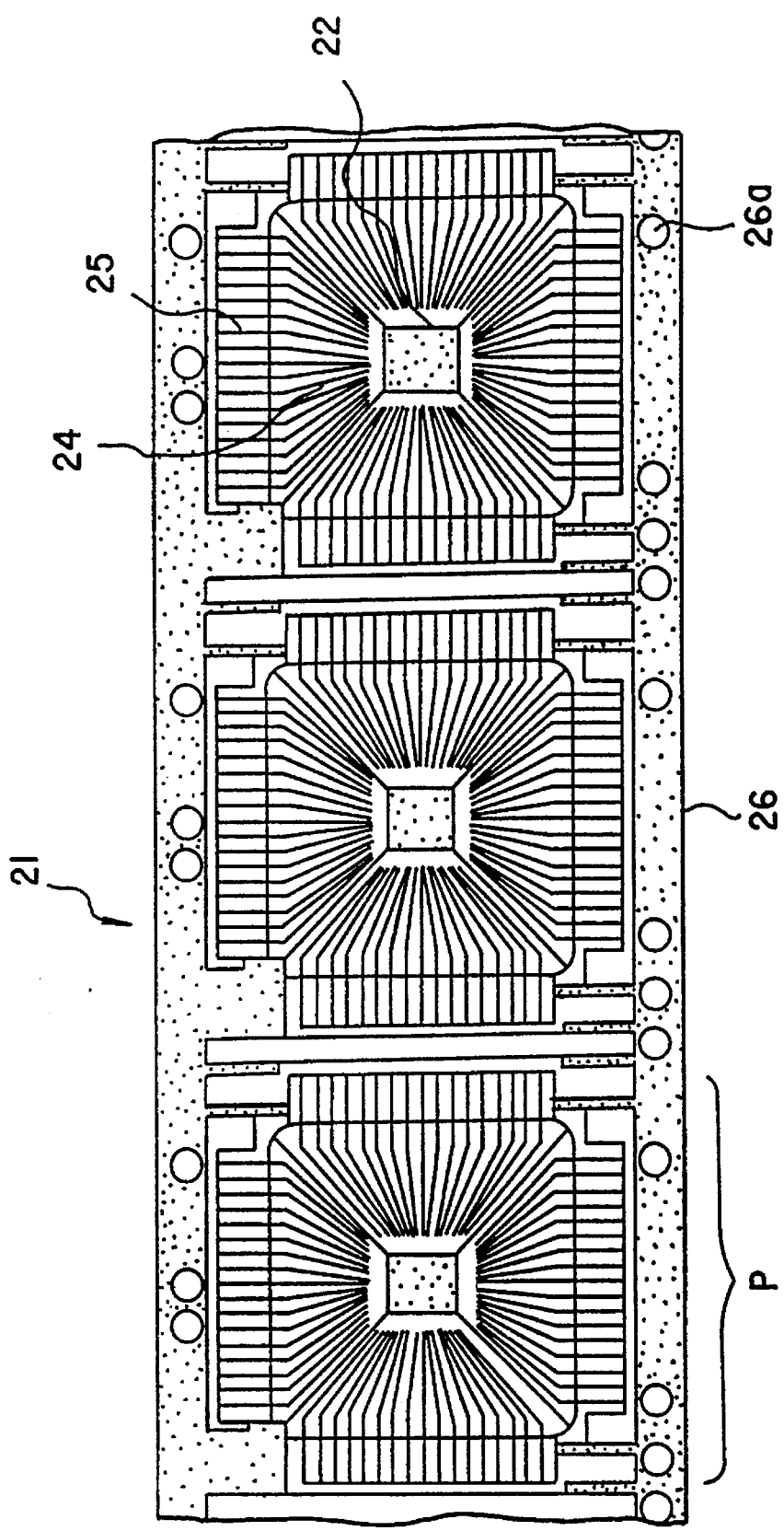
FIG. 1 is a plan view showing a principal portion of a conventional lead frame.
Figure 2A:
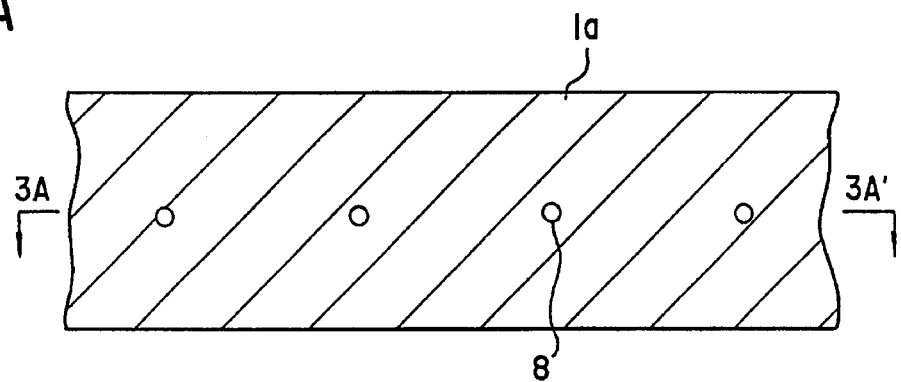
FIGS. 2A to 2C are schematic plan views showing a manner in which a lead frame is manufactured by a first embodiment of a method of the present invention.
Figure 2B:
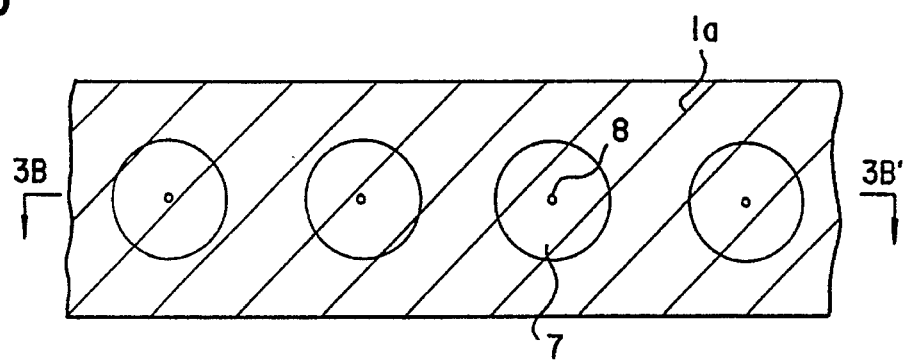
Figure 2C:
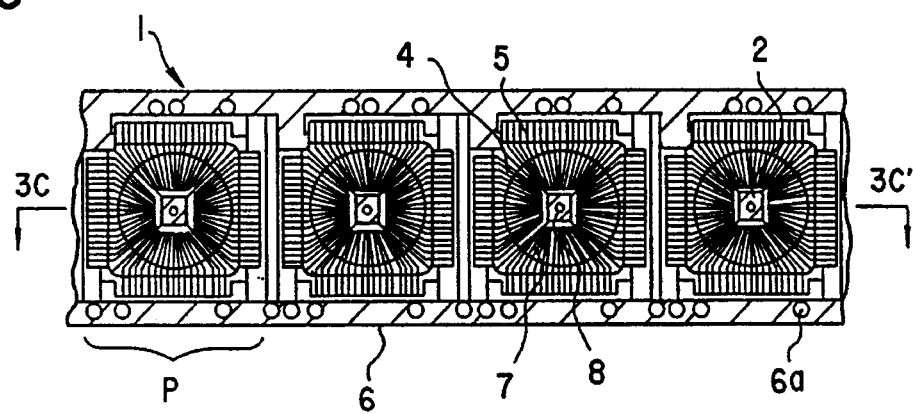
Figure 3A:
FIGS. 3A to 3C are schematic cross-sectional views showing a manner in which a lead frame is manufactured by the first embodiment of the method of the present invention.
Figure 3B:
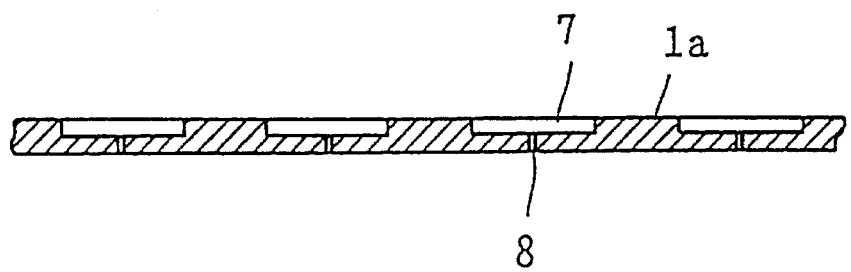
Figure 3C:
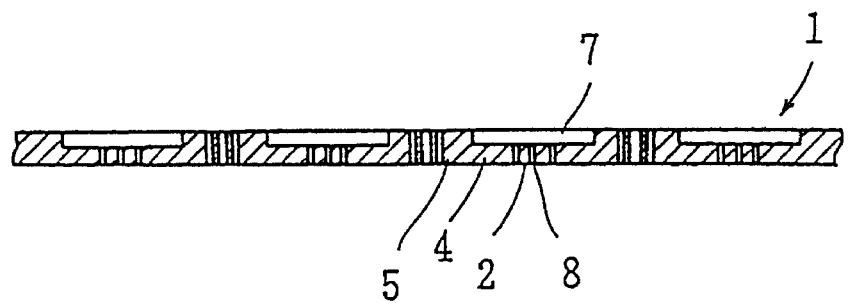

A manufacturing method which is a first embodiment of the present invention will be described with reference to FIGS. 2A to 2C and 3A to 3C. FIGS. 2A to 2C are plan views showing a manner in which a metal plate 1a which is used as a lead frame member is formed into a lead frame 1 according to this embodiment. FIGS. 3A to 3C are cross-sectional views taken on lines A–A', B–B" and C–C" of FIGS. 2A to 2C, respectively.

As a material of the metal plate 1a, a material is chosen such as Fe—Ni alloy, Cu alloy or ferromaterial which have conventionally been used as a material for a lead frame.

In the manufacturing method of this embodiment, after a hole 8 is formed in the substantial center of a predetermined area on the metal plate 1a as shown in FIG. 2A, a concave portion 7 is formed by pressurizing the predetermined area to cause plastic deformation as shown in FIG. 2B, and thereafter, an island 2 of the lead frame 1 is formed in the concave portion 7 as shown in FIG. 2C.

Specifically, first, the hole 8 is punched in the center of the predetermined area on the flat metal plate 1a by use of a punching metal mold as shown in FIG. 2A. The hole 8 may be formed by etching.

As the metal plate 1a, the following can be used: a metal strip of a length, for example, corresponding to the length of 10 packages; a metal plate where portions corresponding to a plurality of packages are arranged in a plurality of rows; and a hoop-shaped metal plate which is wound around a reel. Metal plates 1a of such configurations are formed into desired lead frames 1 through various necessary processings.

Figure 4:
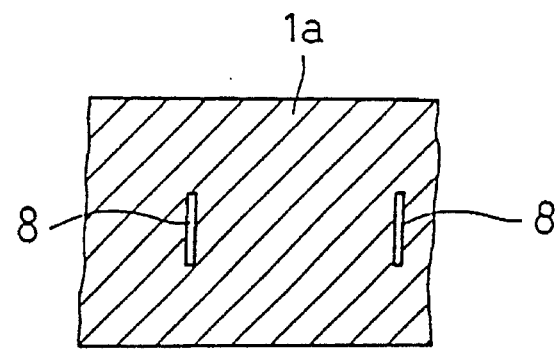
FIG. 4 is a schematic plan view showing holes of another configuration provided in a lead frame member in embodiments of the method of the present invention.
Figure 5:
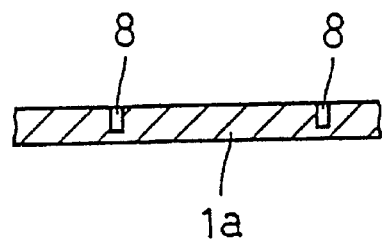
FIG. 5 is a schematic cross-sectional view showing holes of still another configuration provided in the lead frame member in the embodiments of the method of the present invention.

Each hole 8 corresponds to one QFP. On the subsequently-described lead frame 1, patterns corresponding to one QFP each are formed in a row along the metal plate 1a. While in this embodiment each hole 8 is formed to be a circular through hole of the same configuration and dimension which penetrates the metal plate 1a along its thickness as shown in FIG. 3A, a hole of another configuration and dimension, for example, a slit as shown in FIG. 4, or a blind hole which does not penetrate the metal plate 1a as shown in FIG. 5 may be formed according to the size of the subsequently-described concave portion 7.

Then, the concave portion 7 of circular shape is formed as shown in FIG. 2B by pressurizing the predetermined area of the metal plate 1a including the hole 8. The concave portion 7 can be formed through pressurizing processing such as rolling and stamping by use of a metal mold. In this embodiment, the concave portion 7 is formed by partly thinning the metal plate 1a through rolling or stamping the predetermined area on the flat metal plate 1a wound in a hoop shape, specifically, a part and a portion to be formed into the island 2 of a subsequently-described inner lead 4 to cause plastic deformation.

Figure 6:
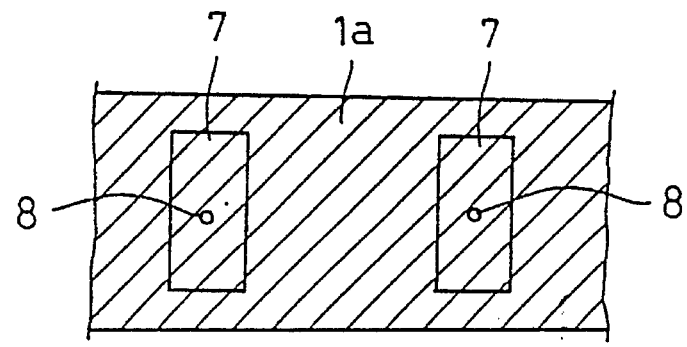
FIG. 6 is a schematic plan view showing concave portions of another configuration provided in the lead frame member in the embodiments of the method of the present invention.

The concave portion 7 is not limited to a circular one formed in this embodiment. It may be rectangular as shown in FIG. 6 or oval (not shown).

Figure 7:
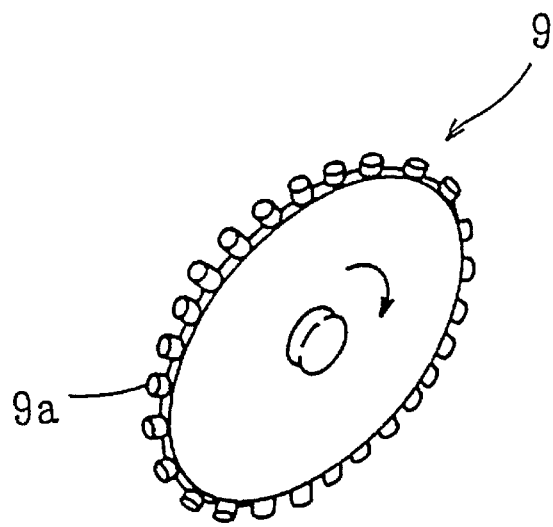
FIG. 7 is a perspective view showing an appearance of a roller used for forming a circular concave portion in the embodiments of the method of the present invention.

FIG. 7 shows a roller 9. On the periphery of the roller 9, a plurality of cylindrical convex portions 9a are provided at predetermined intervals. Now, the metal plate 1a is placed on a flat working plane of a flat working bench, and the roller 9 is rolled on the metal plate 1a while being pressed thereonto at a predetermined pressure. Then, portions on the metal plate 1a onto which the convex portions 9a are pressed are plastic-deformed through the pressurizing, so that the circular concave portions 7 as shown in FIG. 2B are successively formed.

Figure 8:
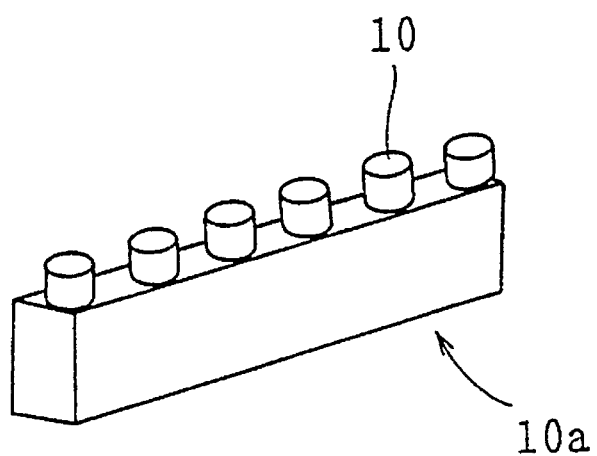
FIG. 8 is a perspective view showing an appearance of a stamping member used for forming a circular concave portion in the embodiments of the method of the present invention.

FIG. 8 shows a block-shaped stamping member 10. On one surface of the stamping member 10, a plurality of cylindrical concave portions 10a are provided at predetermined intervals. Similar to the case of the roller 9, a plurality of cylindrical concave portions 7 can simultaneously be made by pressing the convex portions 10a onto the metal plate 1a.

Figure 9:
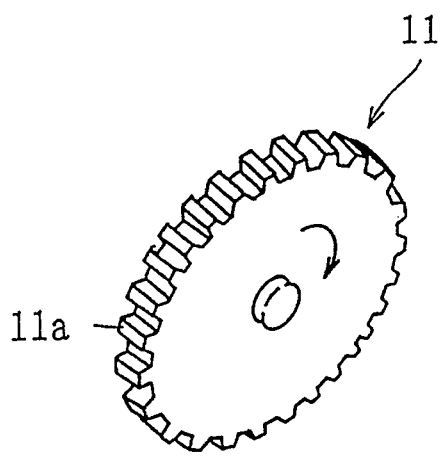
FIG. 9 is a perspective view showing an appearance of a roller used for forming a rectangular concave portion in the embodiments of the method of the present invention.

FIG. 9 shows a roller 11 of another configuration. The roller 11 has a similar configuration to that of the roller 9 of FIG. 7 except that convex portions 11a are of rectangular parallelepiped. The concave portions 7 are formed on the metal plate 1a by rolling the roller 11 on the metal plate 1a while pressurizing it in a similar manner to the roller 9 of FIG. 7. In this case, rectangular concave portions as shown in FIG. 6 are formed on the metal plate 1a.

Figure 10:
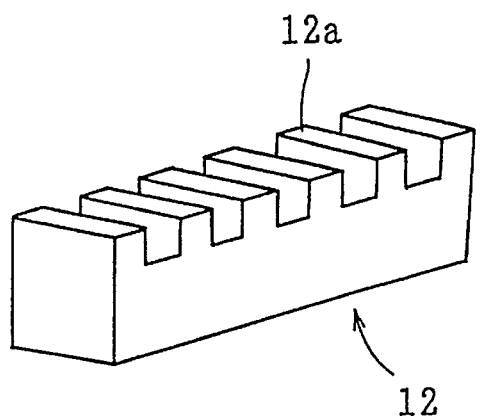
FIG. 10 is a perspective view showing an appearance of a stamping member used for forming a rectangular concave portion in the embodiments of the method of the present invention.

FIG. 10 shows a stamping member 12 of another configuration. The stamping member 12 has a similar configuration to that of the sampling member 10 of FIG. 8 except that convex portions 12a are of rectangular parallelepiped. The concave portions 7 are formed by pressing the stamping member 12 onto one surface of the metal plate 1a similarly to the stamping member 10 of FIG. 8. In this case, rectangular concave portions as shown in FIG. 6 can be formed on the metal plate 1a.

In the metal plate 1a formed through the above-described pressurizing processing, the concave portions 7 are formed only on one surface of the lead frame 1 as shown in FIG. 2B and the other surface is uniformly flat. As a result, the island 2 and the inner lead 4 located in an area where the concave portions 7 are formed are thinner than the outer lead 5 located outside the area where the concave portions 7 are formed.

While in this embodiment the concave portions 7 are formed only on one surface of the metal plate 1a, they may be formed on both surfaces of the metal plate 1a by pressing the roller 9 or 11 or the stamping member 10 or 12 as shown in FIGS. 7 to 10 onto the both surfaces of the metal plate 1a. As mentioned above, the bottom surface of the concave portion 7 is not limited to an entirely flat surface.

While in this embodiment the metal plate 1a is provided with portions of two kinds of thickness, that is, a thick portion and a thin portion, by forming a plurality of concave portions 7 of a uniform depth in a row along the length of the metal plate 1a, the present invention is not limited thereto: the metal plate 1a may be provided with portions of three or more kinds of thickness by providing a hole so that a plurality of portions of different thickness are formed on the metal plate 1a and then forming a plurality of concave portions of two or more kinds of depth in an area including the hole.

Figure 11:
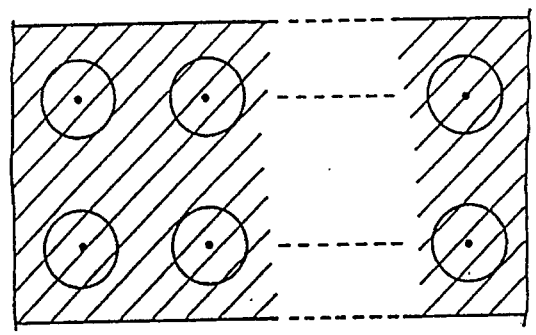
FIG. 11 is a schematic plan view showing another state of an arrangement of concave portions provided in the lead frame member in the embodiments of the method of the present invention.

Further, by providing a plurality of rows of concave portions on the flat metal plate 1a as shown in FIG. 11, a plurality of semiconductor chips can simultaneously be resin-molded. In a case where a plurality of rows of concave portions are formed as described above, it is convenient if, in the rollers 9 and 11 and the stamping members 10 and 12 as shown in FIGS. 7 to 10, the convex portions are formed in the number of rows corresponding to the number of rows of the concave portions to be formed. This is because all the concave portions can simultaneously be made.

When the metal plate 1a is partly thinned by forming the concave portions 7 in the predetermined area on the metal plate 1a as described above, the material of the metal plate 1a is extended toward the hole 8 side by the applied pressure as shown in FIGS. 2B and 3B while the partly thinning process, so that the hole 8 becomes smaller due to the extension of the plastic-deformed portion. As a result, since inner stress generated in the metal plate material in the predetermined area due to the pressurizing is not accumulated inside because of the displacement of the plastic-deformed portion toward the hole 8 side, generation of distortion of the metal plate 1a is prevented to the utmost while the concave portions 7 are being formed.

While in this embodiment the metal plate 1a is partly thinned by forming the concave portions 7 in a part and a portion to be formed into the island 2 of the inner lead 4, it is also possible to realize a thinner package by only thinning the portion to be formed into the island 2.

Then, the island 2 of the lead frame 1 is formed in the concave portion 7 by forming a lead pattern on the metal plate 1a. The lead pattern can be formed by use of a known technique such as punching and etching.

Figure 12:
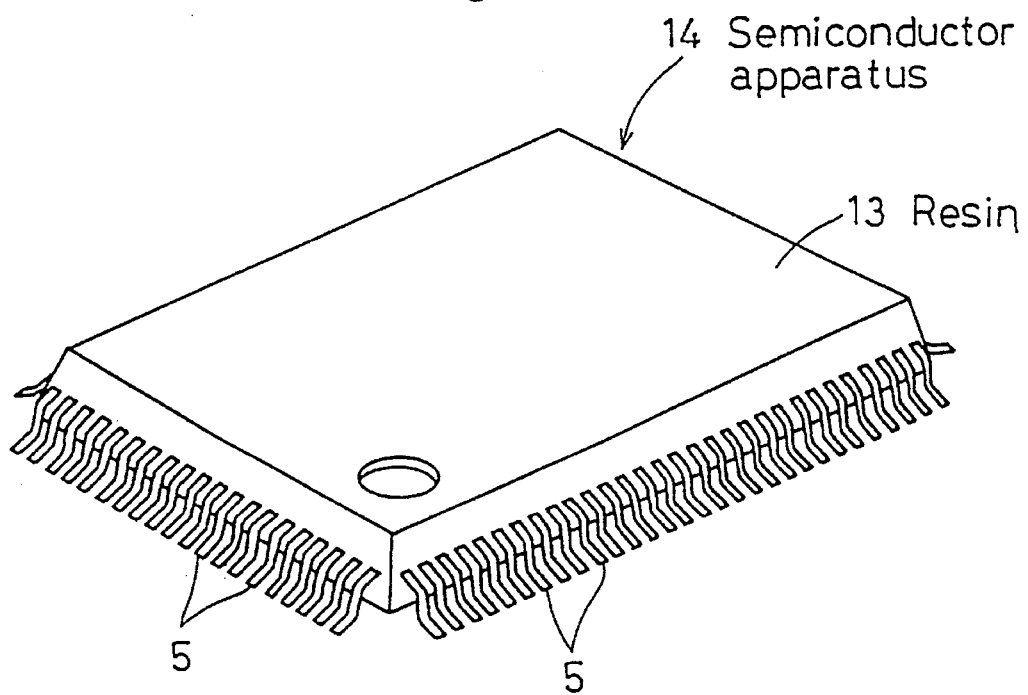
FIG. 12 is a perspective view showing an appearance of a semiconductor apparatus obtained by the embodiments of the method of the present invention.
Figure 13:
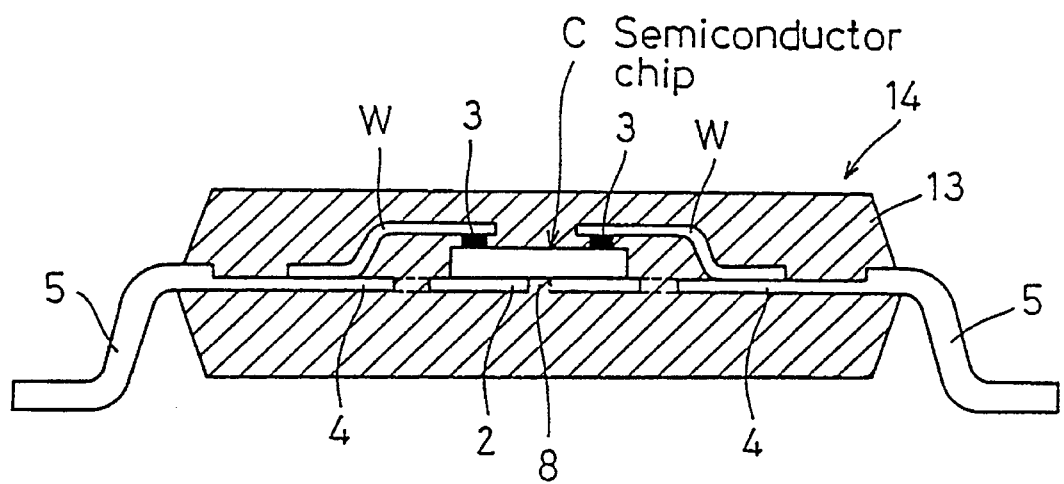
FIG. 13 is a cross-sectional view showing the semiconductor apparatus obtained by the embodiments of the method of the present invention.

The lead frame 1 manufactured in the above described manner includes, as shown in FIGS. 2C, 12 and 13, the island 2, a plurality of inner leads 4 connected through a wire W to electrodes 3 of a semiconductor chip C provided to the island 2, the outer lead 5 formed continuously from the inner lead 4 for connection to a substrate, and a guide rail 6 provided with a guide hole 6a for positioning. The island 2 and the inner lead 4 are molded by being capsulated in a resin 13 at the time of resin molding. The outer lead 5 is exposed out of the resin 13. The island 2 and the inner lead 4 are formed to be thinner than the outer lead 5. The hole 8 is provided to the outer lead 5. P shows an area corresponding to one package.

Although a circle representing the periphery of the concave portion 7 is drawn in a solid line in FIG. 2C, in actuality, each inner lead 4 is separated from adjoining inner leads 4 and located between the outer lead 5 and the island 2 under a condition having a thin portion and a thick portion as shown in FIG. 3C.

In manufacturing a semiconductor apparatus (QFP) by use of the above-described lead frame 1, after the semiconductor chip C is bonded onto the island 2 of the lead frame 1 in the chip bonding process, the tips of the inner leads 4 extending toward the island 2 and the electrodes 3 of the semiconductor chip C are connected with gold wire in the wire bonding process. Thereafter, the island 2 and the inner leads 4 are molded by being capsulated in resin in the resin molding process, and the molded portion is cut off from the lead frame 1 in a lead cut process. By the above-described method, a QFP 14 is obtained.

In the QFP 14 manufactured as described above, since the island 2 is formed to be thin as shown in FIG. 3C, the obtained QFP 14 is much thinner than conventional ones even under a condition where the semiconductor chip C is die-bonded thereonto and the wire bonding process is executed with respect thereto. Since the inner lead 4 is also formed to be thin, pitch fining of the inner lead 4 is possible.

Further, as shown in FIGS. 2C and 3C, the hole 8 remains in the substantial center of the island 2 of the lead frame 1. The hole 8, which has become smaller than its original size due to the formation of the concave portion 7 as described above, functions to absorb and ease the stress generated in the island 2 in the die bonding process. As a result, generation of the distortion due to die bonding is prevented to the utmost. In a case where a lead pattern is formed by mechanically applying force, generation of the distortion due to the lead pattern formation is also prevented by the presence of the hole 8 similarly to the case of the distortion due to the formation of the concave portions 7.

The configuration and dimension of the hole 8 may be adjusted, if necessary, so that the hole 8 is closed at the time when a lead pattern is formed.

Figure 14A:
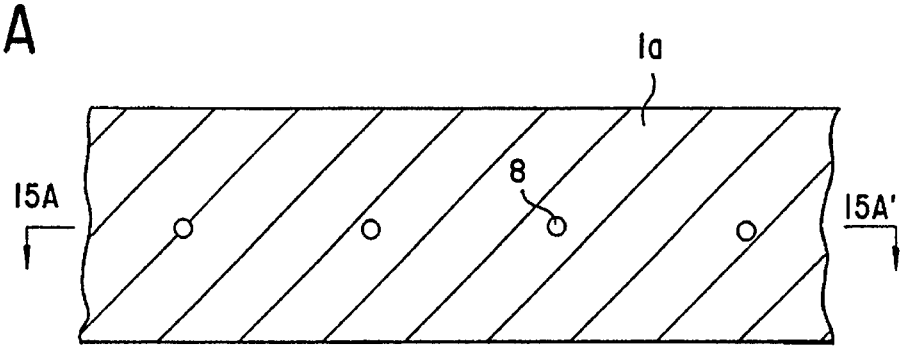
FIGS. 14A to 14C are schematic plan views showing a manner in which a lead frame is manufactured by a second embodiment of the method of the present invention.
Figure 14B:
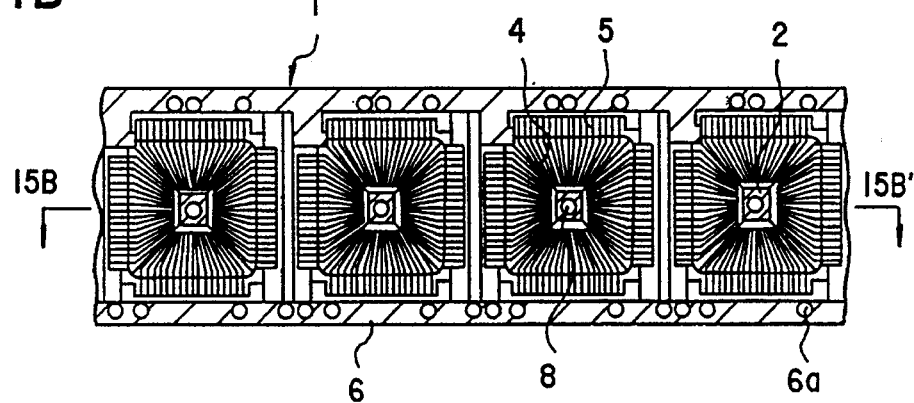
Figure 14C:
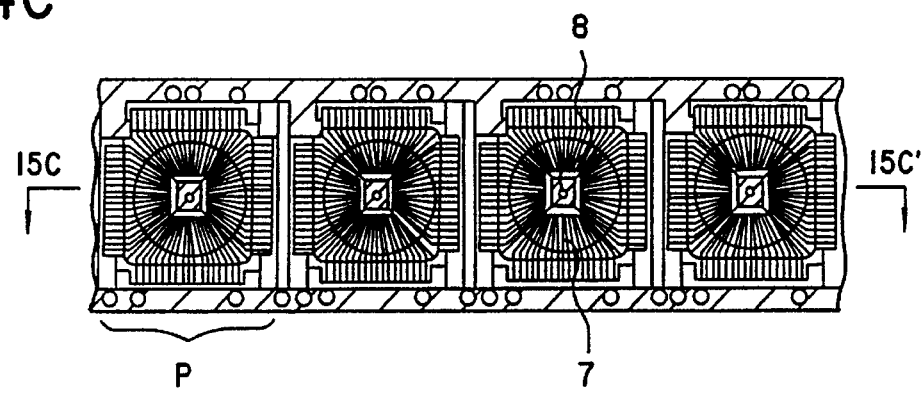
Figure 15A:
FIGS. 15A to 15C are schematic cross-sectional views showing a manner in which the lead frame is manufactured by the second embodiment of the method of the present invention.
Figure 15B:
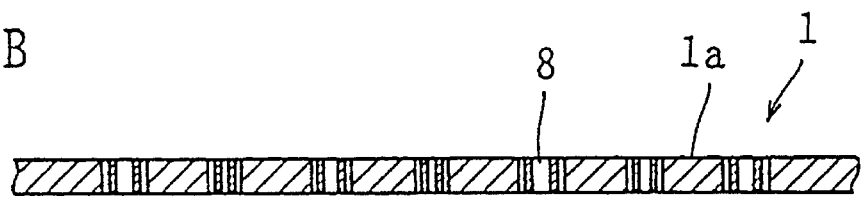
Figure 15C:
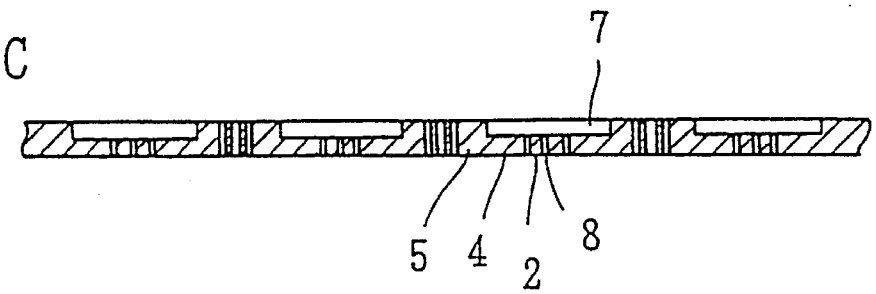

A manufacturing method which is a second embodiment of the present invention will be described with reference to FIGS. 14A to 14C and 15A to 15C. FIGS. 14A to 14C are plan views showing a manner in which a metal plate 1a which is used as a lead frame member is formed into a lead frame 1 according to this embodiment. FIGS. 15A to 15C are cross-sectional views taken on lines A–A', B–B' and C–C' of FIGS. 14A to 14C, respectively.

In the manufacturing method of this embodiment, after a hole 8 is formed in the substantial center of a predetermined area on the metal plate 1a as shown in FIG. 14A, an island 2 of a lead frame 1 is formed in the predetermined area as shown in FIG. 14B, and thereafter, the predetermined portion where the island 2 is formed is thinned by pressurizing the predetermined area where the island 2 is formed to cause plastic deformation. That is, the method of this embodiment is the same as that of the first embodiment except that a concave portion 7 is formed as shown in FIG. 14C after a lead pattern as shown in FIG. 14B is formed.

Specifically, first, the hole 8 is punched in the predetermined area on the flat metal plate 1a as shown in FIGS. 14A and 15A. Then, a lead pattern is formed so that the hole 8 is located at the center of the island 2 as shown in FIGS. 14B and 15B. At this time, if the lead pattern is mechanically formed, for example, by punching, distortion of the metal plate 1a generated thereby is absorbed and eased by the hole 8 similarly to the first embodiment. However, since the amount of the distortion is not so large, the size of the hole does not reduced so much.

Then, similarly to the first embodiment, the island 2 and a part of the inner lead 4 are thinned by forming the concave portion 7 through a mechanical pressing as shown in FIGS. 14C and 15C. As a result, a lead frame 1 similar to that of the first embodiment is formed. Since the island 2 is provided with the hole 8, the predetermined area of the metal plate 1a constituting the island 2 is extended toward the hole 8 side during the pressurizing processing. As a result, generation of the distortion of the metal plate 1a is prevented.

Figure 16A:
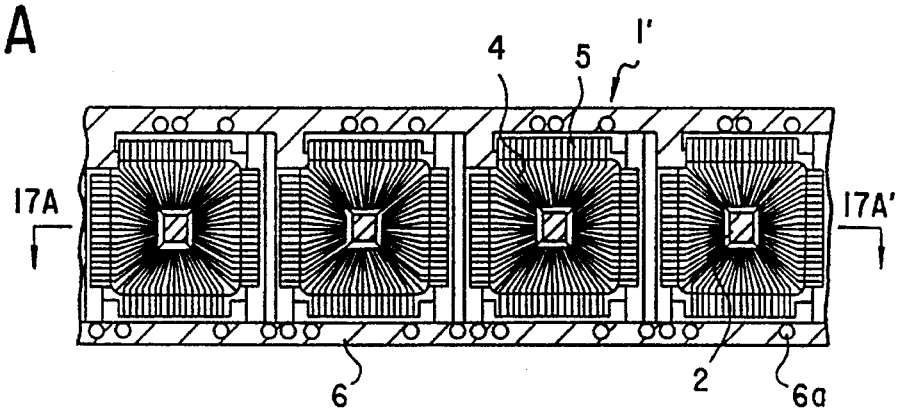
FIGS. 16A to 16C are schematic plan views showing a manner in which a lead frame is manufactured by a third embodiment of the method of the present invention.
Figure 16B:
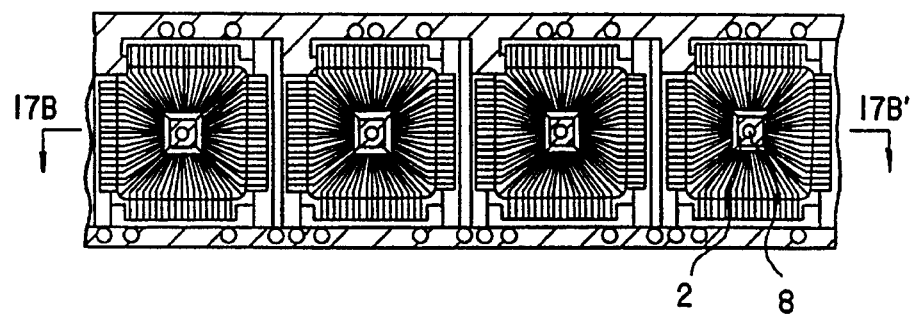
Figure 16C:
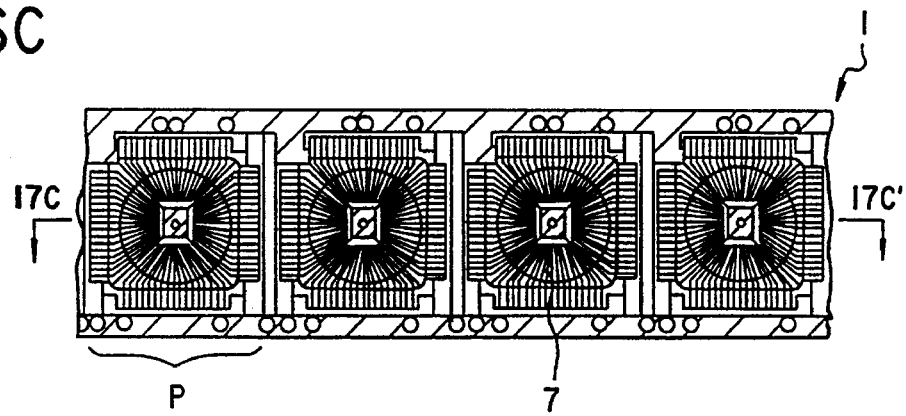
Figure 17A:
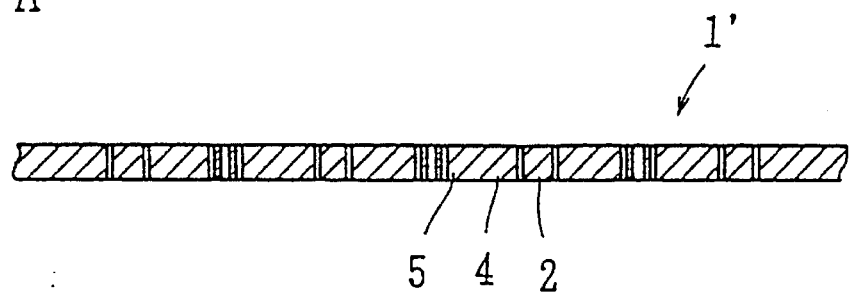
FIGS. 17A to 17C are schematic cross-sectional views showing a manner in which the lead frame is manufactured by the third embodiment of the method of the present invention.
Figure 17B:
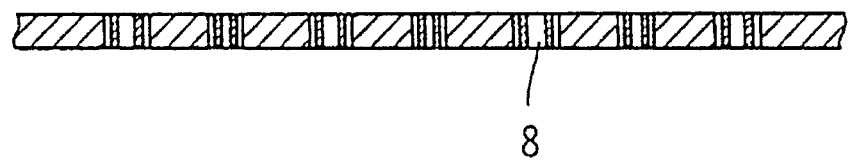
Figure 17C:
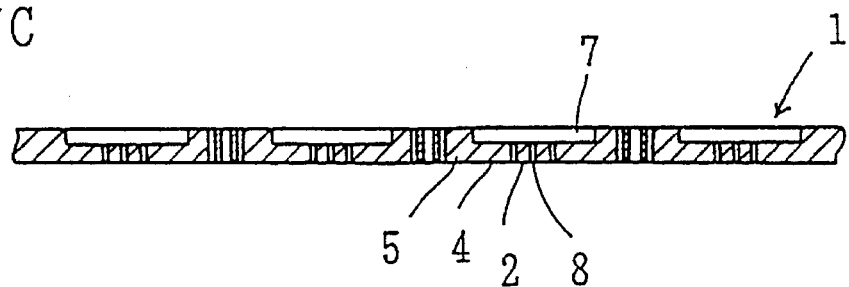

Subsequently, a manufacturing method which is the third embodiment of the present invention will be described with reference to FIGS. 16A to 16C and 17A to 17C. FIGS. 16A to 16C are plan views showing a manner in which a lead frame 1 is formed from a conventional lead frame 1' according to the method of this embodiment. FIGS. 17A to 17C are cross-sectional views taken on lines A–A', B–B' and C–C' of FIGS. 16A to 16C, respectively.

In the manufacturing method of this embodiment, after a hole 8 is formed as shown in FIG. 16B in an island 2 of the conventional lead frame 1' on which a lead pattern as shown in FIG. 16A is formed, a portion where the island 2 is formed is thinned by pressurizing a predetermined area where the island 2 is formed as shown in FIG. 16C to cause plastic deformation. That is, the method of this embodiment is the same as that of the first embodiment except that a process of forming the hole 8 as shown in FIG. 16B and a process of forming a concave portion 7 as shown in FIG. 16C are executed after the lead pattern as shown in FIG. 16A is formed.

Specifically, the conventional lead frame 1' is formed as shown in FIGS. 16A and 17A. Then, the hole 8 is formed at the center of the island 2 as shown in FIGS. 16B and 17B. By forming the hole 8, a condition the same as that of FIGS. 14B and 15B of the second embodiment is obtained. By forming the concave portion 7 in a similar manner to that of the second embodiment, the lead frame 1 similar to that of the first embodiment is formed.

As described above, according to the semiconductor apparatus manufacturing method of the present invention, since after the hole 8 is formed along the thickness of the lead frame member 1a, the concave portion 7 is formed in a predetermined area including the hole 8 on the lead frame member 1a by pressurizing the predetermined area to cause plastic deformation so that the lead frame member is thinned, inner stress generated in the material for the lead frame member 1a during the pressurizing of the predetermined area is not accumulated inside because of the displacement of the extended plastic-deformed portion toward the hole 8 side. As a result, a semiconductor apparatus can be realized where its lead frame is partly thinned without any distortion being generated in the lead frame member 1a during the formation of the concave portion 7.

In a semiconductor apparatus obtained by the above-mentioned manufacturing method, since the hole 8 is located at the center of the island 2 where the semiconductor chip C is provided, generation of the distortion due to the die bonding can be prevented in spite that a portion including the island 2 is formed to be thinner than the outer lead 5. In addition, package cracking can be prevented. Further, by forming the island 2 to be thinner than the outer lead 5, the thickness of a semiconductor apparatus such as an IC package can be reduced without the strength and heat conduction capacity of the outer lead 5 being deteriorated.

Moreover, by providing the hole 8 to the island 2 and forming the island 2 and the inner lead 4 to be thinner than the outer lead 5, the inner lead 4 can be fined without the strength and heat conduction capacity of the outer lead 5 being deteriorated. As a result, the degree of freedom in lead frame designing increases, and lead fining, that is, increase in the number of terminals can be coped with.

Furthermore, the strength of the guide rail 6 formed on the both ends of the lead frame and the strength of the outer lead 5 can further be increased. Further, by thinning the inner lead 4 and the island 2 and by forming the hole 8 in the island 2, the amount of use of a lead frame member made of an expensive precious metal can be reduced to reduce the cost.

Obviously, many modifications and variations of the present invention are possible in light of the above teachings. It is therefore to be understood that within the scope of the appended claims, the invention may be practiced other than as specifically described.

What is claimed is:

1. A semiconductor apparatus comprising:

an island formed in a predetermined area of a lead frame, said island including a) a concave portion formed in the predetermined area in the lead frame member so that the island in the lead frame member has a first thickness and b) a hole formed in the concave portion;

a semiconductor chip provided on the concave portion over said hole;

a resin for molding the island and the semiconductor chip; and an outer lead formed on a portion of the lead frame outside the predetermined area and exposed out of the resin, the outer lead being a second thickness which is thicker than the first thickness of the island.

2. A semiconductor chip comprising:

an island formed in a predetermined area of a lead frame, said island including a) a concave portion formed in the predetermined area in the lead frame member so that the island of the lead member has a first thickness and b) a hole formed in the concave portion;

a semiconductor chip provided on the concave portion over said hole;

an inner lead at least a part of which is formed in the predetermined area of the lead frame and connected to an electrode of the semiconductor chip;

a resin for molding the island, the inner lead and the semiconductor chip; and an outer lead formed continuously from an outer end portion of the inner lead and exposed out of the resin, the outer lead being a second thickness which is thicker than the first thickness of the island and the inner lead.

\* \* \* \* \*